(12) United States Patent
Chen

(10) Patent No.: US 7,746,165 B1
(45) Date of Patent: Jun. 29, 2010

(54) VOLTAGE SELECTING CIRCUIT, VOLTAGE PROVIDING CIRCUIT UTILIZING THE VOLTAGE SELECTING CIRCUIT, AND SIGNAL DELAYING SYSTEM UTILIZING THE VOLTAGE PROVIDING CIRCUIT

(75) Inventor: Chih-Jen Chen, Kaohsiung County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 12/357,376

(22) Filed: Jan. 21, 2009

(30) Foreign Application Priority Data

Jan. 5, 2009 (TW) .............................. 98100095 A

(51) Int. Cl.
G05F 1/10 (2006.01)
G05F 3/02 (2006.01)
(52) U.S. Cl. .................... 327/544; 327/538; 327/539
(58) Field of Classification Search ................. 327/538, 327/540, 544
See application file for complete search history.

(56) References Cited

U.S. PATENT DOCUMENTS

| | | | |
|---|---|---|---|
| 5,815,028 A * | 9/1998 | Reynolds ................... 327/543 |
| 5,973,528 A * | 10/1999 | Halamik et al. ............ 327/198 |
| 6,366,155 B1 * | 4/2002 | Moon et al. ................. 327/530 |
| 6,906,576 B2 * | 6/2005 | Sivero et al. ................ 327/536 |
| 7,436,246 B2 * | 10/2008 | Park ............................ 327/540 |
| 7,551,020 B2 * | 6/2009 | Bhattacharya et al. ...... 327/538 |
| 7,583,034 B2 * | 9/2009 | Lara-Ascorra et al. ...... 315/291 |
| 2009/0212853 A1 * | 8/2009 | Kim et al. .................... 327/539 |
| 2009/0237152 A1 * | 9/2009 | Do .............................. 327/540 |
| 2010/0026380 A1 * | 2/2010 | Chen et al. .................. 327/544 |

* cited by examiner

Primary Examiner—Lincoln Donovan
Assistant Examiner—Adam D Houston
(74) Attorney, Agent, or Firm—Winston Hsu

(57) ABSTRACT

A voltage providing circuit includes: a first voltage providing circuit, for generating a first voltage; a switch device, for receiving a first voltage; a second voltage providing circuit, for providing a second voltage; a control circuit, for controlling the switch device and the second voltage providing circuit, wherein in a first mode, the control circuit turns off the switch device for allowing a target device to receive the second voltage, and in a second mode, the control circuit turns on the switch device and stops the second voltage providing circuit from providing the second voltage such that the target device can receive the first voltage; and an adjusting circuit, for providing a reference voltage to the first voltage providing circuit according to the first voltage and the second voltage for changing the first voltage, thereby making the first voltage substantially equal to the second voltage.

6 Claims, 3 Drawing Sheets

"VOLTAGE SELECTING CIRCUIT, VOLTAGE
PROVIDING CIRCUIT UTILIZING THE
VOLTAGE SELECTING CIRCUIT, AND
SIGNAL DELAYING SYSTEM UTILIZING
THE VOLTAGE PROVIDING CIRCUIT

BACKGROUND OF THE INVENTION

1. Field of the Invention

The present invention relates to a voltage selecting circuit and a voltage providing circuit utilizing this voltage selecting circuit, and more particularly, to a signal delaying system utilizing the aforementioned voltage selecting circuit and voltage providing circuit.

2. Description of the Prior Art

In a typical memory control system, a delayed lock loop (DLL) circuit is generally utilized to provide a required clock signal. The memory can be operated in a normal mode, a self refresh mode, or a power down mode. The normal mode is that the memory is normally accessed and the DLL operates normally for delaying an input signal (usually a clock signal) to generate a delayed signal. The self refresh mode is that the memory executes self refreshing without any help from an external circuit. The power down mode is that the memory is in a stand-by mode without performing any data access.

In the normal mode of the memory, the DLL circuit is provided with a DLL voltage ($V_{DLL}$, it can also be viewed as a control voltage) to control delay time of the DLL circuit. In the self refresh mode or the power down mode of the memory, a stand-by voltage is provided to the DLL circuit while the DLL voltage provided to the DLL circuit is stopped. However, there exist some problems in this conventional mechanism. FIG. 1 illustrates a conventional relationship between the control voltage and standby voltage provided to a DLL circuit according to the prior art. As shown in FIG. 1, the control voltage is usually higher than the stand-by voltage. Therefore, after providing a stand-by voltage to the DLL circuit while stopping providing the DLL voltage to the DLL circuit, a specific time td is required to raise the voltage if the DLL circuit intends to go back in the normal mode, which leads to a delay in time as well as a drawback in the overall circuit system.

SUMMARY OF THE INVENTION

Therefore, one objective of the present invention is to provide an adjusting mechanism to solve the aforementioned time delay problem resulted from the control voltage and stand-by voltage in the prior art.

According to one embodiment of the present invention, a voltage providing circuit is disclosed. The voltage providing circuit comprises: a first voltage providing circuit, for generating a first voltage; a switch element, for receiving the first voltage; a control circuit, for controlling the switch element and the second voltage providing circuit, wherein in a first mode, the control circuit turns off the switch element for allowing a target apparatus to receive the second voltage, and in a second mode, the control circuit turns on the switch element and stops the second voltage providing circuit from providing the second voltage, thereby providing the first voltage to the target apparatus; and an adjusting circuit, coupled to the first voltage providing circuit and the second voltage providing circuit, for providing a reference voltage to the first voltage providing circuit according to the first voltage and the second voltage for altering the first voltage, thereby making the first voltage substantially equal to the second voltage.

According to another embodiment of the present invention, a signal delaying system is disclosed. The signal delaying system comprises: a delay locked loop (DLL) circuit, for delaying an input signal to generate a delay signal; and a voltage providing circuit, for providing a control voltage to the DLL circuit to determine a delay time of the DLL circuit when the DLL circuit operates in a first mode; and for providing a stand-by voltage to the DLL circuit, wherein the voltage providing circuit further adjust the stand-by voltage to make the stand-by voltage substantially equal to the control voltage.

According to yet another embodiment of the present invention, a voltage selecting system is disclosed. The voltage selecting system comprises: a comparator, for comparing a first voltage and a second voltage to generate a comparison result; a counter, coupled to the comparator, for generating a counting signal according to the comparison result; and a multiplexer, coupled to the counter, for receiving a plurality of candidate voltages and selecting one of the candidate voltages as an output voltage according to the counting result.

According to the aforementioned embodiments, the time delay problem resulted from the difference between the control voltage and the stand-by voltage in the prior art design can be compensated and solved.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Besides, the term "couple" is used here to refer any kind of direct or indirect electrical connection. Therefore, if a first apparatus is coupled to a second apparatus in the description, it means that the first apparatus is directly electrically connected to the second apparatus or indirectly connected to the second apparatus through other apparatus or method.

Figure 1:
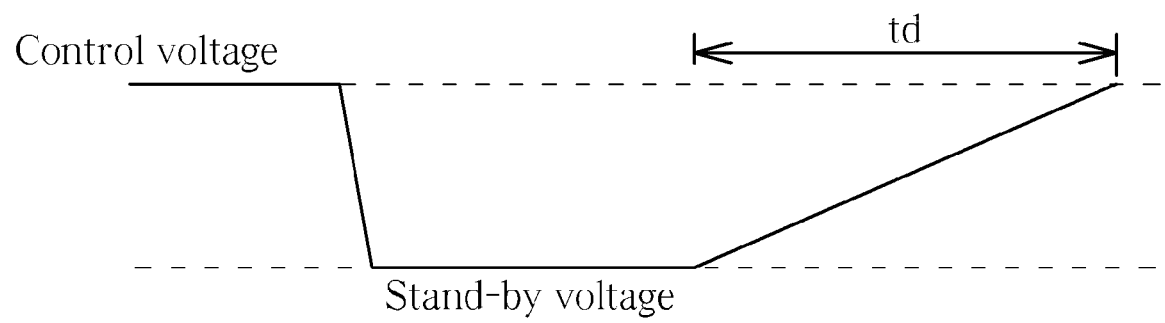
FIG. 1 is a diagram illustrating a relationship between a control voltage and a stand-by voltage provided to a DLL circuit according to the prior art.
Figure 2:
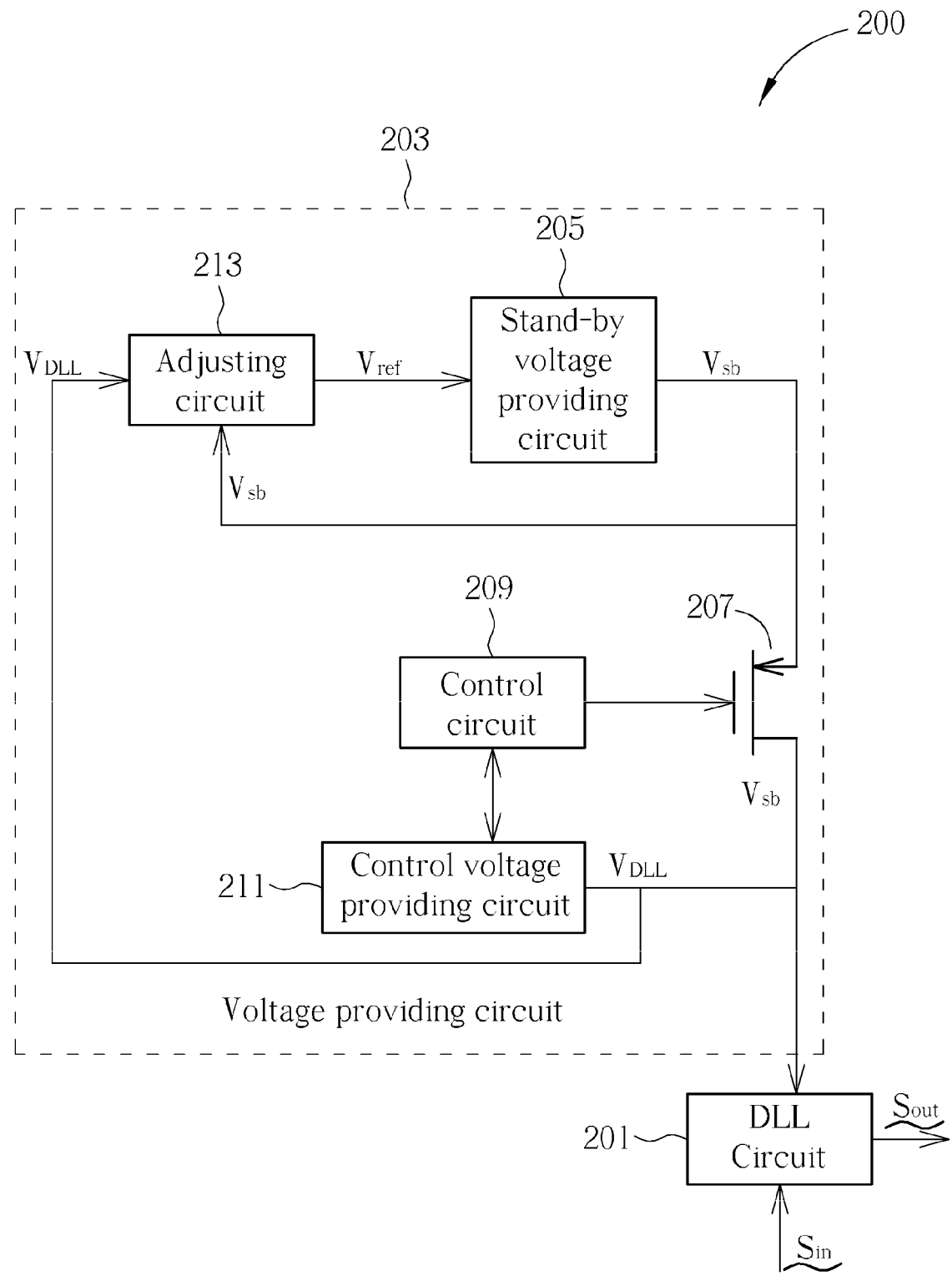
FIG. 2 is a diagram illustrating a signal delay system according to the present invention.

FIG. 2 illustrates a signal delaying system 200 according to an embodiment of the present invention. As shown in FIG. 2, the signal delaying system 200 comprises a DLL circuit 201 and a voltage providing circuit 203. The DLL circuit 201 delays an input signal $S_{in}$ to generate a delayed signal $S_{out}$. The voltage providing circuit 203 provides a control voltage $V_{DLL}$ to the DLL circuit 201 for determining a delay time of the DLL circuit 201 when the DLL circuit 201 operates in a first mode, and provides a stand-by voltage $V_{sb}$ to the DLL circuit 201 when the DLL circuit 201 operates in a second mode. The voltage providing circuit 203 further adjusts the stand-by voltage $V_{sb}$ to make the stand-by voltage $V_{sb}$ equal to the control voltage $V_{DLL}$. In this way, the aforementioned problem in the prior art can be avoided. When the circuit architecture shown in FIG. 2 is utilized in a memory (e.g., a Dynamic Random Access Memory, DRAM), i.e., the delayed signal $S_{out}$ is provided to a memory, the first mode represents that the memory operates in a normal mode, and the second mode represents that the memory operates in a self refresh mode or a power down mode.

In one exemplary embodiment, the voltage providing circuit 203 comprises a stand-by voltage providing circuit 205, a switch element 207 (e.g., a PMOS transistor in this embodiment), a control circuit 209, a control voltage providing circuit 211, and an adjusting circuit 213. The stand-by voltage providing circuit 205 is configured for generating the stand-by voltage $V_{sb}$. The switch element 207 is configured for receiving the stand-by voltage $V_{sb}$. The control circuit 209 is configured for controlling the switch element 207 and the control voltage providing circuit 211. The control voltage 211 is configured for providing the control voltage $V_{DLL}$.

The control circuit 209 controls the control voltage providing circuit 211 to provide the control voltage $V_{DLL}$ and makes the switch element 207 not conduct when the DLL circuit 201 is in the first mode. When the DLL circuit 201 enters the second mode, the control circuit 209 stops the control voltage providing circuit 211 from providing the control voltage $V_{DLL}$ to the DLL circuit 201, and makes the switch element 207 conduct to provide the stand-by voltage $V_{sb}$ to the DLL circuit 201. The adjusting circuit 213 provides a reference voltage $V_{ref}$ to the stand-by voltage providing circuit 205 according to the stand-by voltage $V_{sb}$ and the control voltage $V_{DLL}$, thereby making the stand-by voltage providing circuit 205 alter the stand-by voltage $V_{sb}$. As a result, the stand-by voltage $V_{sb}$ is substantially equal to the control voltage $V_{DLL}$. It should be noted that the voltage providing circuit 203 is not limited to providing a voltage to the DLL circuit 201; in other words, the voltage providing circuit 203 can be configured for providing a voltage to other electronic apparatus as well. In this case, the operation of the voltage providing circuit 203 can be as follows: providing a first voltage for a target apparatus when the target apparatus is in a first mode; providing a second voltage for the target apparatus and adjusting the first and the second voltage to make them substantially equal to each other when the target apparatus is in a second mode.

Figure 3:
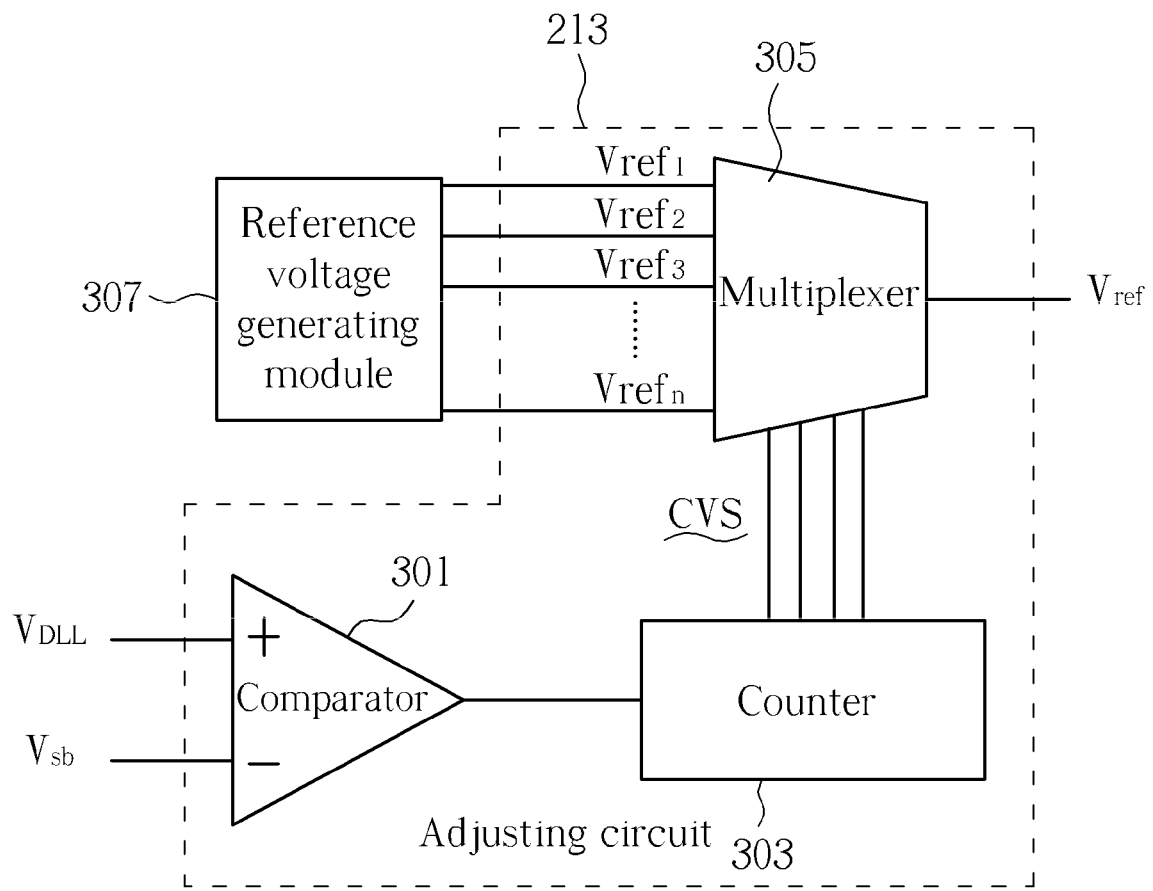
FIG. 3 is a diagram illustrating a preferred embodiment of an adjusting circuit shown in FIG. 2.

FIG. 3 illustrates a preferred embodiment of the adjusting circuit 213 shown in FIG. 2. It should be noted that the circuit architecture shown in FIG. 3 is for illustrative purposes only, and it is not meant to be a limitation to the scope of this invention. As shown in FIG. 3, the adjusting circuit 213 comprises a comparator 301, a counter 303, and a multiplexer 305. The comparator 301 compares the stand-by voltage $V_{sb}$ with the control voltage $V_{DLL}$ to generate a comparison result. The counter 303 generates a counting signal CVS according to the comparison result. The multiplexer 305 receives a plurality of candidate voltages $V_{ref1}$-$V_{refn}$, and selects one of the candidate voltages $V_{ref1}$-$V_{refn}$ as the reference voltage $V_{ref}$ according to the counting signal CVS. In one exemplary embodiment, when the control voltage $V_{DLL}$ is higher than the stand-by voltage $V_{sb}$, the counter 303 counts once, for example, to make a 4-bit signal "1000" become "1001". Therefore, the selected reference voltage $V_{ref}$ will be different. In another exemplary embodiment, when the control voltage $V_{DLL}$ is higher than the stand-by voltage $V_{sb}$, a higher reference voltage $V_{ref}$ is selected; otherwise, a lower reference voltage $V_{ref}$ is selected. The selection principle is not meant to be a limitation to the present invention. It should be noted that the circuit shown in FIG. 3 can be utilized in an architecture other than the one shown in FIG. 2. In this case, the comparator 301 compares a first voltage with a second voltage to generate a comparison result, the counter 303 generates a counting signal CVS according to the comparison result, and the multiplexer 305 receives a plurality of candidate voltages $V_{ref1}$-$V_{refn}$ and selects one of the candidate voltages $V_{ref1}$-$V_{refn}$ as the reference voltage $V_{ref}$ according to the counting signal CVS. In addition, the adjusting circuit 213 shown in FIG. 3 can also be viewed as a voltage selecting circuit.

According to the aforementioned exemplary embodiments, the time delay problem resulted from the difference between the control voltage and the stand-by voltage in the prior art design can be compensated and solved.

Those skilled in the art will readily observe that numerous modifications and alterations of the device and method may be made while retaining the teachings of the invention.

What is claimed is:

1. A voltage providing circuit, comprising:
   a first voltage providing circuit, for providing a first voltage;
   a switch element, for receiving the first voltage;
   a second voltage providing circuit, for providing a second voltage;
   a control circuit, for controlling the switch element and the second voltage providing circuit, wherein in a first mode, the control circuit turns off the switch element for allowing a target apparatus to receive the second voltage, and in a second mode, the control circuit turns on the switch element, and stops the second voltage providing circuit from providing the second voltage to therefore provide the first voltage to the target apparatus; and
   an adjusting circuit, coupled to the first voltage providing circuit and the second voltage providing circuit, for providing a reference voltage to the first voltage providing circuit for altering the first voltage, according to the first voltage and the second voltage, thereby making the first voltage substantially equal to the second voltage.

2. The voltage providing circuit of claim 1, wherein the target apparatus is a delay locked loop circuit, and the second voltage is for controlling a delay time of the delay locked loop circuit.

3. The voltage providing circuit of claim 2, wherein the delay locked loop circuit is utilized in a memory, the first mode corresponds to a normal mode in which the memory operates, and the second mode corresponds to a power down mode or a self refresh mode in which the memory operates.

4. The voltage providing circuit of claim 1, wherein the adjusting circuit provides a higher reference voltage when the first voltage is higher than the second voltage.

5. The voltage providing circuit of claim 4, wherein the adjusting circuit provides a lower reference voltage when the first voltage is lower than the second voltage.

6. The voltage providing circuit of claim 1, wherein the adjusting circuit comprises:
   a comparator, for comparing the first voltage and the second voltage to generate a comparison result;
   a counter, coupled to the comparator, for generating a counting signal according to the comparison result; and
   a multiplexer, coupled to the counter, for receiving a plurality of candidate voltages and selecting one of the candidate voltages as the reference voltage according to the counting signal.

* * * * *